United States Patent [19]
Maeda

[11] Patent Number: 6,018,535
[45] Date of Patent: Jan. 25, 2000

[54] EXTERNAL CAVITY TYPE WAVELENGTH-TUNABLE LIGHT SOURCE

[75] Inventor: Minoru Maeda, Tokyo, Japan

[73] Assignee: Ando Electric Co., LTD., Tokyo, Japan

[21] Appl. No.: 09/295,301

[22] Filed: Apr. 21, 1999

[30] Foreign Application Priority Data

Apr. 23, 1998 [JP] Japan .................. 10-113739

[51] Int. Cl.[7] ....................................... H01S 3/10
[52] U.S. Cl. .................. 372/20; 372/32; 372/102; 372/98; 372/107
[58] Field of Search ............... 372/20, 32, 102, 372/98, 107

[56] References Cited

U.S. PATENT DOCUMENTS

| | | | |
|---|---|---|---|
| 5,347,527 | 9/1994 | Favre et al. | 372/20 |
| 5,550,850 | 8/1996 | Lee et al. | 372/20 |
| 5,594,744 | 1/1997 | Lefevre et al. | 372/20 |
| 5,802,085 | 9/1998 | Lefevre et al. | 372/20 |
| 5,862,162 | 1/1999 | Maeda | 372/20 |

*Primary Examiner*—Leon Scott, Jr.
*Attorney, Agent, or Firm*—Finnegan, Henderson, Farabow, Garrett & Dunner, L.L.P.

[57] ABSTRACT

An external cavity type wavelength-tunable light source including an optical amplifier on one end surface of which an antireflection film is coated, a diffraction grating arranged on an emission light axis of the optical amplifier on the side of the antireflection film and having wavelength selectivity, a reflector arranged on a reflection light axis of the diffraction grating, for reflecting a reflection light beam from the diffraction grating, and a wavelength tuning mechanism for tuning a wavelength of an lasing light beam by changing an angle of the reflector relative to the reflection light axis of the diffraction grating. The wavelength tuning mechanism includes a bimorph type piezo-electric element as a wavelength-tunable controlling unit for changing an angle of the reflector relative to the reflection light axis of the diffraction grating, and a wavelength-tunable driving circuit for controlling a voltage applied to the bimorph type piezo-electric element to tune the wavelength of the lasing light beam.

9 Claims, 4 Drawing Sheets

EXTERNAL CAVITY TYPE WAVELENGTH-TUNABLE LIGHT SOURCE

BACKGROUND OF THE INVENTION

1. Field of the Invention

The present invention relates to an external cavity type wavelength-tunable light source which is employed in the optical measuring technical field, for example.

2. Description of the Related Art

As a light source which is employed in the optical measuring technology, a small light source which has a wavelength stability in a single mode lasing of a narrow spectral linewidth and can tune a wavelength is requested.

As a conventional external cavity type wavelength-tunable light source, an external cavity type wavelength-tunable light source, as shown in FIGS. 7 and 8, for example, has been known.

FIG. 7 is a block diagram showing a configurational example of a conventional external cavity type wavelength-tunable light source.

This external cavity type wavelength-tunable light source comprises an optical amplifier 1, an optical amplifier driving circuit 4, lenses 5, 6 and 7, an optical isolator 9, a diffraction grating 2, an angle adjusting mechanism 51, a wavelength-tunable driving circuit 53, a parallel moving mechanism 52, a position adjustment driving circuit 54 and the like.

The optical amplifier 1 is formed of a Fabry-Perot type semiconductor laser (LD). An antireflection film (AR coat) 1a is coated on one end surface of the optical amplifier 1. The optical amplifier 1 emits light beams from both end surfaces thereof in response to an injection current from the optical amplifier driving circuit 4.

A light beam emitted from an end surface of the optical amplifier 1 on the antireflection film 1a side is converted into a collimated light beam by the lens 5 and then input into the diffraction grating 2.

The diffraction grating 2 is used as a wavelength selecting reflector, and has a function of reflecting a light beam, which has a particular wavelength decided by an incident angle, out of the collimated light beams being input. Also, the diffraction grating 2 and an end surface of the optical amplifier 1 on which the antireflection film 1a is not coated constitute a laser cavity. When the light beam being selected by the diffraction grating 2 is irradiated once again into the optical amplifier 1, laser lasing can be generated.

The lens 6 is arranged on the emission light axis on the side of the optical amplifier 1 where the antireflection film 1a is not coated, and converts the light beam emitted from the end surface of the optical amplifier 1 into the collimated light beam. The emitted light beam being converted into the collimated light beam is input into the optical isolator 9.

The optical isolator 9 is provided so as not to return the reflected light beam being emitted from the output fiber 8 side to the optical amplifier 1. The light beam being transmitted through the optical isolator 9 is converged by the lens 7 and then irradiated into the output fiber 8 as an output light beam.

An optical arrangement of the optical amplifier 1 and the diffraction grating 2, as shown in FIG. 7, is called a Littrow arrangement.

A lasing wavelength by the Littrow arrangement optical system can be given by $$\lambda = 2 \times d/M \times \sin(\theta) \qquad (1)$$

where $\lambda$ is a wavelength selected by the diffraction grating 2, d is a recess interval of the diffraction grating 2, M is a degree of the diffracted light beam, and $\theta$ is an angle between a normal of the diffraction grating 2 and the emission light axis of the optical amplifier 1 (incident angle onto the diffraction grating 2).

Then, the diffraction grating 2 can be adjusted to have any angle ($\theta$) with respect to the incident light axis by the angle adjusting mechanism 51.

The diffraction grating 2 can be rotated to any angle by controlling the angle adjusting mechanism 51 by using the wavelength-tunable driving circuit 53, and thus the wavelength (Bragg wavelength) calculated by Eq. (1) can be changed arbitrarily. As a result, the wavelength can be tuned within a gain range of the optical amplifier 1.

In addition, the diffraction grating 2 can be moved by the parallel moving mechanism 52 in parallel with the incident light axis.

The diffraction grating 2 can be moved in parallel with the light axis of the cavity by controlling the parallel moving mechanism 52 by virtue of the position adjustment driving circuit 54 to then change the lasing wavelength arbitrarily.

FIG. 8 shows another configurational example of a conventional external cavity type wavelength-tunable light source.

This external cavity type wavelength-tunable light source comprises an optical amplifier 1, an optical amplifier driving circuit 4, lenses 5, 6 and 7, an optical isolator 9, a diffraction grating 2, a reflector 3, an angle adjusting mechanism 51, a wavelength-tunable driving circuit 53 and the like.

In this case, in FIG. 8, the same parts as those shown in FIG. 7 are designated by the same reference numerals and their description will be omitted.

An optical arrangement of the optical amplifier 1, the diffraction grating 2 and the reflector 3, as shown in FIG. 8, is called a Littman arrangement.

A lasing wavelength by the Littman arrangement optical system can be given by $$\lambda = d/M \times [\sin(\alpha) + \sin(\beta)] \qquad (2)$$

where $\lambda$ is a wavelength selected by the diffraction grating 2, d is a recess interval of the diffraction grating 2, M is a degree of the diffracted light beam, $\alpha$ is an angle between the normal of the diffraction grating 2 and the emission light axis of the optical amplifier 1 (incident angle onto the diffraction grating 2), and $\beta$ is an angle between the normal of the diffraction grating 2 and the reflection light axis of the light beam reflected by the diffraction grating 2 (reflection angle from the diffraction grating 2).

The diffraction grating 2 is fixed to an optical base platform 10 to have an incident angle $\alpha$ relative to the emission light axis of the optical amplifier 1.

The reflector 3 is arranged on the angle adjusting mechanism 51, and reflects again the light beam, which has the wavelength irradiated perpendicularly to the reflector 3, out of the reflected light beam from the diffraction grating 2 calculated by Eq. (2), onto the diffraction grating 2.

The angle adjusting mechanism 51 changes the angle of the reflector 3 around a rotation center 51a so as to adjust the reflector 3 at any angle with respect to the reflection light axis from the diffraction grating 2.

Therefore, the selected wavelength can be changed freely by adjusting the angle of the reflector 3 by virtue of a driving system of the angle adjusting mechanism 51, so that the wavelength variation can be performed within a gain range of the optical amplifier 1.

Also, continuous wavelength variation can be carried out without mode hopping by optimizing the positions of the rotation center 51a of the angle adjusting mechanism 51 and the reflector 3.

In the conventional external cavity type wavelength-tunable light sources (FIGS. 7 and 8), a rotation stage, a linear stage and the like are employed as the angle adjusting mechanism 51 and the parallel moving mechanism 52.

However, according to the conventional external cavity type wavelength-tunable light source in which the rotation stage, the linear stage and the like are employed as the angle adjusting mechanism 51 and the parallel moving mechanism 52, precise change of the wavelength has not been able to be implemented because of generation of mechanical backlash.

Further, in order to control the above mechanisms with good precision, a motor with built-in high precision gears is needed in addition to the rotation stage and the linear stage. In this case, there has been such a problem that the wavelength tuning mechanism is increased in size.

SUMMARY OF THE INVENTION

The present invention has been made to overcome the above problems, and it is an object of the present invention to provide an external cavity type wavelength-tunable light source in which a wavelength tuning mechanism is small in size and no backlash of the mechanism is generated in tuning the wavelength, and which has good precision in tuning the wavelength.

In order to achieve the above object, according to a first aspect of the invention, there is provided an external cavity type wavelength-tunable light source comprising: an optical amplifier on one end surface of which an antireflection film is coated; a diffraction grating arranged on an emission light axis of the optical amplifier on the side of the antireflection film and having wavelength selectivity; a reflector arranged on a reflection light axis of the diffraction grating, for reflecting a reflection light beam from the diffraction grating; and a wavelength tuning mechanism for tuning a wavelength of an lasing light beam by changing an angle of the reflector relative to the reflection light axis of the diffraction grating, wherein the wavelength tuning mechanism includes: fixing means at least a part of which is composed of an elastic body to support the reflector; displacing means for changing an angle of the reflector relative to the reflection light axis of the diffraction grating by deforming the elastic body of the fixing means; and displacement controlling means for controlling the displacing means to adjust change in the angle of the reflector and to thus tune the wavelength of the lasing light beam.

In the above external cavity type wavelength-tunable light source, the angle of the reflector relative to the reflection light axis of the diffraction grating can be changed by deforming the elastic body of the fixing means for supporting the reflector by using the displacing means under control of the displacement controlling means, so that the wavelength of the light beam which is input perpendicularly into the reflector from the diffraction grating, i.e., the wavelength of the lasing light beam is tuned.

According to a second aspect of the invention, there is provided an external cavity type wavelength-tunable light source comprising: an optical amplifier on one end surface of which an antireflection film is coated; a diffraction grating arranged on an emission light axis of the optical amplifier on the side of the antireflection film and having wavelength selectivity; a reflector arranged on a reflection light axis of the diffraction grating, for reflecting a reflection light beam from the diffraction grating; and a wavelength tuning mechanism for tuning a wavelength of an lasing light beam by changing an angle of the diffraction grating relative to the emission light axis of the optical amplifier, wherein the wavelength tuning mechanism includes: fixing means at least a part of which is composed of an elastic body to support the diffraction grating; displacing means for changing an angle of the diffraction grating relative to the emission light axis of the optical amplifier by deforming the elastic body of the fixing means; and displacement controlling means for controlling the displacing means to adjust change in the angle of the diffraction grating and to thus tune the wavelength of the lasing light beam.

In the above external cavity type wavelength-tunable light source, the angle of the diffraction grating relative to the normal of the reflector can be changed by deforming the elastic body of the fixing means for supporting the diffraction grating by using the displacing means under control of the displacement controlling means, so that the wavelength of the light beam which is input perpendicularly into the reflector from the diffraction grating, i.e., the wavelength of the lasing light beam is tuned.

According to a third aspect of the invention, there is provided an external cavity type wavelength-tunable light source comprising: an optical amplifier on one end surface of which an antireflection film is coated; a bandpass filter arranged on an emission light axis of the optical amplifier on the side of the antireflection film and having wavelength selectivity; a reflector arranged on an emission light axis of the optical amplifier, for reflecting a transmission light beam from the bandpass filter to the emission light axis of the optical amplifier; and a wavelength tuning mechanism for tuning a wavelength of an lasing light beam by changing an angle of the bandpass filter relative to the emission light axis of the optical amplifier, wherein the wavelength tuning mechanism includes: fixing means at least apart of which is composed of an elastic body to support the bandpass filter; displacing means for changing an angle of the bandpass filter relative to the emission light axis of the optical amplifier by deforming the elastic body of the fixing means; and displacement controlling means for controlling the displacing means to adjust change in the angle of the bandpass filter and to thus tune the wavelength of the lasing light beam.

In the above external cavity type wavelength-tunable light source, the angle of the bandpass filter relative to the emission light axis of the optical amplifier can be changed by deforming the elastic body of the fixing means for supporting the bandpass filter by using the displacing means under control of the displacement controlling means, so that the wavelength of the light beam which is transmitted through the bandpass filter, i.e., the wavelength of the lasing light beam is tuned.

DETAILED DESCRIPTION OF THE PREFERRED EMBODIMENTS

Respective embodiments of an external cavity type wavelength-tunable light source according to the present invention will be described in detail with reference to FIGS. 1 to 6 hereinafter.

<First Embodiment>

Figure 1:
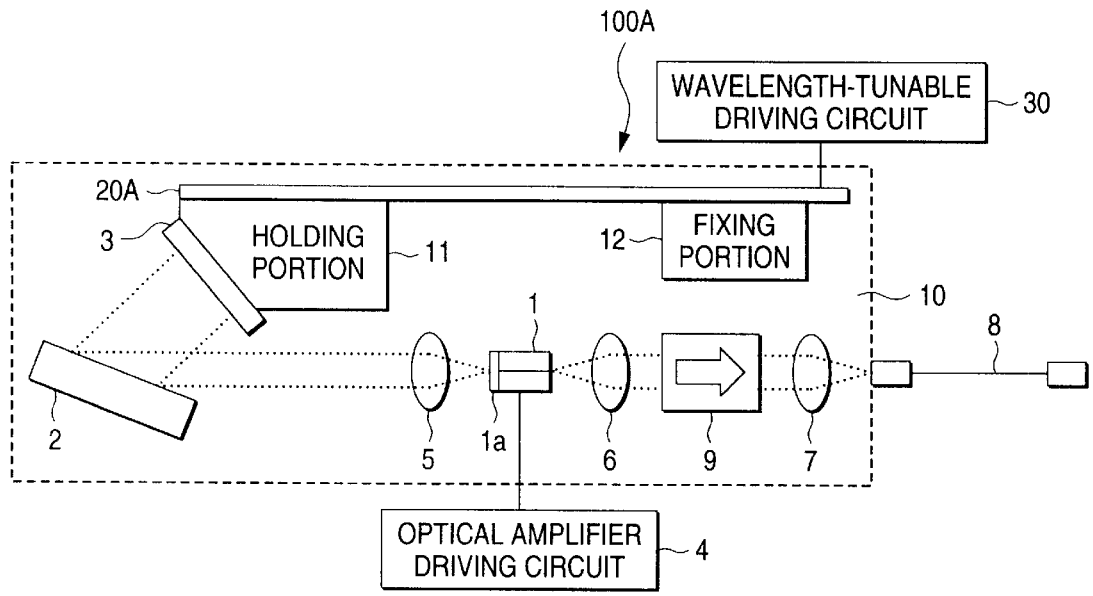
FIG. 1 is a block diagram showing a configuration of an external cavity type wavelength-tunable light source according to a first embodiment to which the present invention is applied.

FIG. 1 is a block diagram showing a configuration of an external cavity type wavelength-tunable light source according to a first embodiment to which the present invention is applied.

The external cavity type wavelength-tunable light source comprises an optical amplifier 1, an optical amplifier driving circuit 4, lenses 5, 6 and 7, an optical isolator 9, a diffraction grating 2, a reflector 3, a wavelength tuning mechanism 100A and the like.

The optical amplifier 1 is formed of a Fabry-Perot type semiconductor laser (LD). An antireflection film (AR coat) 1a is coated on one end surface of the optical amplifier 1. The optical amplifier 1 is connected to the optical amplifier driving circuit 4, and emits light beams from both end surfaces thereof in response to an injection current from the optical amplifier driving circuit 4.

The lens 5 is placed on an emission light axis on the antireflection film 1a side of the optical amplifier 1, and converts a light beam emitted from the end surface of the optical amplifier 1 into a collimated light beam. The emitted light beam converted into the collimated light beam is input into the diffraction grating 2.

The diffraction grating 2 is fixed to an optical base platform 10 to have an incident angle α relative to an emission light axis of the optical amplifier 1. The diffraction grating 2 can function as a wavelength selecting reflector, and reflects a light beam, which has a wavelength indicated by above Eq. (2), out of the collimated light beams irradiated at the incident angle α, to the reflector 3 side at a reflection angle β.

The reflector 3 reflects only the light beam, which has the wavelength being irradiated perpendicularly onto the reflector 3, out of the reflected light beams from the diffraction grating 2 via the same optical path. The light beams which have the wavelength being irradiated onto the reflector 3 at other angles are reflected to the diffraction grating 2 via different optical paths.

More particularly, the light beam having the wavelength which input perpendicularly into the reflector 3 and reflected therefrom is input again into the diffraction grating 2, and then is reflected to the emission light axis of the optical amplifier 1 at an incident angle equal to the above reflection angle β and a reflection angle equal to the above incident angle α to return to the optical amplifier 1. In contrast, other light beams except the light beam having the wavelength which inputs perpendicularly into the reflector 3 are reflected at angles different from those relative to the emission light axis of the optical amplifier 1, and such beans are never returned to the optical amplifier 1.

The lens 6 is arranged on the emission light axis on the side of the optical amplifier 1 where the antireflection film 1a is not coated, and converts the light beam emitted from the end surface of the optical amplifier 1 into the collimated light beam. The emitted light beam converted into the collimated light beam is input into the optical isolator 9.

The optical isolator 9 is provided so as not to return the reflected light beam being emitted from the output fiber 8 side to the optical amplifier 1. The light beam being transmitted through the optical isolator 9 is converged by the lens 7 and then irradiated into the output fiber 8 as an output light beam.

The above optical system is the same as the conventional Littman arrangement optical system.

The wavelength tuning mechanism 100A comprises a fixing portion 12 and a holding portion 11 set forth as a fixing means, a wavelength-tunable controlling unit (bimorph type piezo-electric element) 20A set forth as an elastic body of the fixing means and a displacing means, and a wavelength-tunable driving circuit 30 set forth as a displacement controlling means. The wavelength tuning mechanism 100A tunes the wavelength of the lasing light beam by changing an angle of the reflector 3 relative to the reflection light axis of the diffraction grating 2.

The wavelength-tunable controlling unit 20A is fixed by the fixing portion 12 on the optical base platform 10 at its one end. The reflector 3 is provided to a free end side of the wavelength-tunable controlling unit 20A via the holding portion 11. The wavelength-tunable controlling unit 20A is composed of the bimorph type piezo-electric element described below, for example.

The bimorph type piezo-electric element is constructed by sticking two sheets of piezo-electric ceramics together. There are a series type in which two sheets are stuck together to direct their polarization directions in the same direction and a parallel type in which two sheets are stuck together to direct their polarization directions in the opposite directions. Normally a metal thin plate is put between two sheets of piezo-electric ceramics as a reinforcing plate.

For example, in the bimorph type piezo-electric element of series type, when the same voltage is applied to electrodes on both surfaces of two sheets of piezo-electric ceramics, voltage difference between the electrodes on the stuck surfaces is caused and thus the entire piezo-electric element is curved and transformed.

Therefore, if the voltage is applied in the situation that one end of the bimorph type piezo-electric element is fixed, for example, the piezo-electric element is curved and transformed and thus the free end side of the piezo-electric element is largely displaced.

Accordingly, the wavelength-tunable controlling unit 20A consisting of the bimorph type piezo-electric element is curved and transformed according to voltage control by the wavelength-tunable driving circuit 30 to then change the angle of the reflector 3 relative to the reflection light axis of the diffraction grating 2.

If the voltage applied to the bimorph type piezo-electric element is controlled by the wavelength-tunable driving circuit 30, the angle of the reflector 3 can be changed and thus the wavelength of the lasing light beam can be tuned.

In this case, difference in the stuck direction of two sheets of the piezo-electric ceramics in the bimorph type piezo-electric element has no influence upon the configuration of the external cavity type wavelength-tunable light source because merely wirings for the wavelength-tunable driving circuit 30, voltage applying direction and the like are different.

As described above, according to the external cavity type wavelength-tunable light source of the first embodiment, displacement is caused in the wavelength-tunable controlling unit (bimorph type piezo-electric element) 20A according to the voltage which is applied by the wavelength-tunable driving circuit 30. As a result, the angle of the reflector 3 which is held on the free end side of the bimorph type piezo-electric element is changed, so that the wavelength of the light beam which is input perpendicularly from the diffraction grating 2 to the reflector 3, i.e., the wavelength of the lasing light beam is changed.

In other words, the wavelength of the lasing light beam can be tuned by controlling electrically the voltage which is applied to the bimorph type piezo-electric element.

Also, since the wavelength is tuned by the wavelength tuning mechanism 100A in which the reflector 3 is held by the bimorph type piezo-electric element, the mechanical backlash which is produced in the rotation stage or the linear stage in the conventional light source can be eliminated, so that it is possible to tune the wavelength with good reproducibility.

Since the bimorph type piezo-electric element is employed in the wavelength tuning mechanism 100A, the configuration of the wavelength tuning mechanism 100A can be made very simple and small as compared with the conventional wavelength tuning mechanism which consists of the rotation stage or the linear stage.

Further, since the bimorph type piezo-electric element has a small generation force but can produce a large value of a displacement amount such as several hundreds $\mu$m when the voltage is applied, change in the angle of the reflector 3 can be enhanced and thus a wide wavelength variation can be achieved.

<Second Embodiment>

Figure 2:
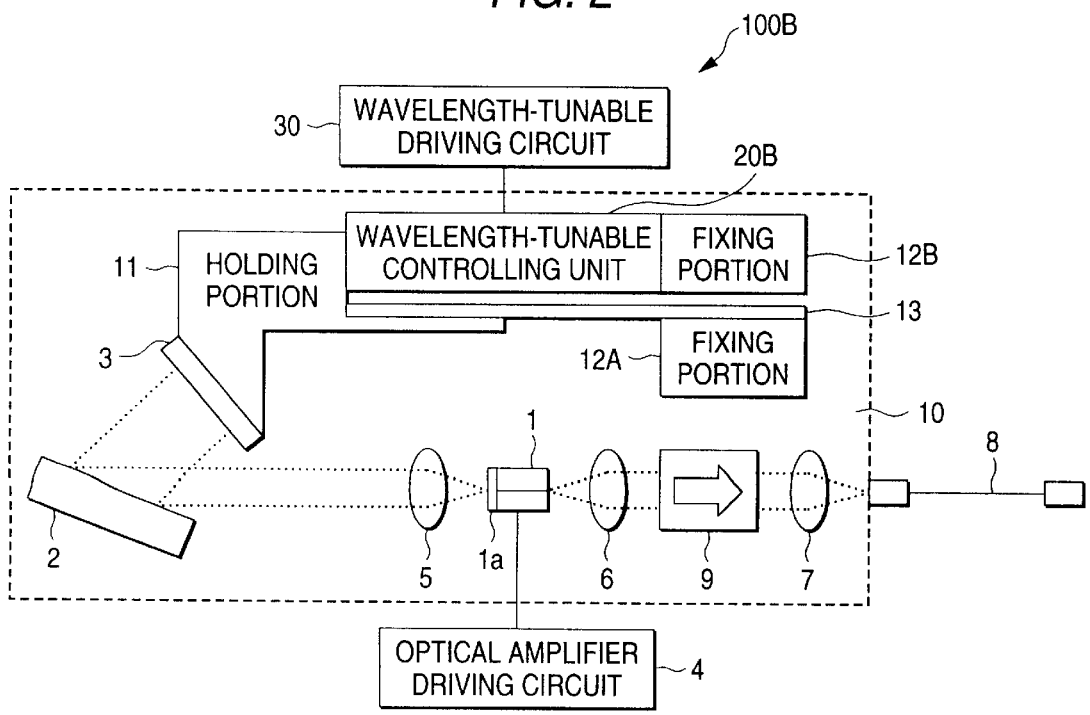
FIG. 2 is a block diagram showing a configuration of an external cavity type wavelength-tunable light source according to a second embodiment to which the present invention is applied.

FIG. 2 is a block diagram showing a configuration of an external cavity type wavelength-tunable light source according to a second embodiment to which the present invention is applied.

In this case, in FIG. 2, the same parts as those shown in above FIG. 1 are designated by the same reference numerals and their description will be omitted.

In the external cavity type wavelength-tunable light source according to the second embodiment, a wavelength tuning mechanism 100B comprises a fixing portion 12A and a holding portion 11 set forth as the fixing means, a leaf spring portion 13 set forth as the elastic body of the fixing means, a wavelength-tunable controlling unit(laminated type piezo-electric element) 20B set forth as the displacing means, a wavelength-tunable driving circuit 30 set forth as the displacement controlling means, a fixing portion 12B for fixing the wavelength-tunable controlling unit 20B and the like.

Other configurations are identical to those of the above first embodiment.

The leaf spring portion 13 is fixed by the fixing portion 12A on the optical base platform 10 at its one end. The reflector 3 is provided to a free end side of the leaf spring portion 13 via the holding portion 11.

The wavelength-tunable controlling unit 20B is placed in the situation that one end of the wavelength-tunable controlling unit 20B is connected to the fixing portion 12B on the optical base platform 10 and the other end thereof is connected to the holding portion 11. The wavelength-tunable controlling unit 20B is composed of the laminated type piezo-electric element described below, for example.

The laminated type piezo-electric element is formed by laminating a number of piezo-electric ceramic elements which can produce distortion when the electric field is applied to the piezo-electric ceramic elements. The piezo-electric ceramic element has such a property that it contracts when the voltage is applied in the same direction as the polarized direction and it expands when the voltage is applied in the opposite direction to the polarized direction, so that physical displacement can be produced according to the applied voltage. The laminated type piezo-electric element has a small displacement according to the applied voltage, but has a large generation force. The displacement amount can be adjusted by exchanging with a piezo-electric element having the different laminated number.

In other words, displacement can be generated in the laminated type piezo-electric element by applying the voltage to the laminated type piezo-electric element serving as the wavelength-tunable controlling unit 20B. Accordingly, the leaf spring portion 13 is flexed to change the angle of the reflector which is arranged at the free end side of the leaf spring portion 3. Therefore, the incident angle relative to the reflection light axis of the diffraction grating 2 is changed, so that the wavelength of the lasing light beam can be tuned.

As described above, according to the external cavity type wavelength-tunable light source of the second embodiment, displacement is caused in the wavelength-tunable controlling unit (laminated type piezo-electric element) 20B according to the voltage which is applied by the wavelength-tunable driving circuit 30. As a result, the leaf spring portion 13 is flexed and the angle of the reflector 3 is changed, so that the wavelength of the light beam which is input perpendicularly into the reflector 3 from the diffraction grating 2, i.e., the wavelength of the lasing light beam is changed.

In other words, the wavelength of the lasing light beam can be tuned by controlling electrically the voltage which is applied to the laminated type piezo-electric element.

Also, since the wavelength is tuned by the wavelength tuning mechanism 100B having a leaf spring structure in which the reflector 3 is supported by the leaf spring portion 13, the mechanical backlash which is produced in the rotation stage or the linear stage in the conventional light source can be eliminated, so that it is possible to tune the wavelength with good reproducibility.

Since the laminated type piezo-electric element and the leaf spring structure are employed in the wavelength tuning mechanism 100B, the configuration of the wavelength tuning mechanism 100B can be made small in size and light in weight as compared with the conventional wavelength tuning mechanism which consists of the rotation stage or the linear stage.

Although the example in which the laminated type piezo-electric element is employed as the wavelength-tunable controlling unit 20B is described in the second embodiment, it is apparent that a motor or the like maybe used as the wavelength-tunable controlling unit 20B. However, if the motor is used as the wavelength-tunable controlling unit 20B, a motor with built-in high precision gears is needed in order to control the above mechanisms with good precision, and there has been such a problem that the wavelength tuning mechanism 100B is increased in size.

The laminated type piezo-electric element employed as the wavelength-tunable controlling unit 20B may be arranged at any location if it can elastically deform the elastic body (leaf spring portion 13) of the fixing means along a predetermined direction.

<Third Embodiment>

Figure 3:
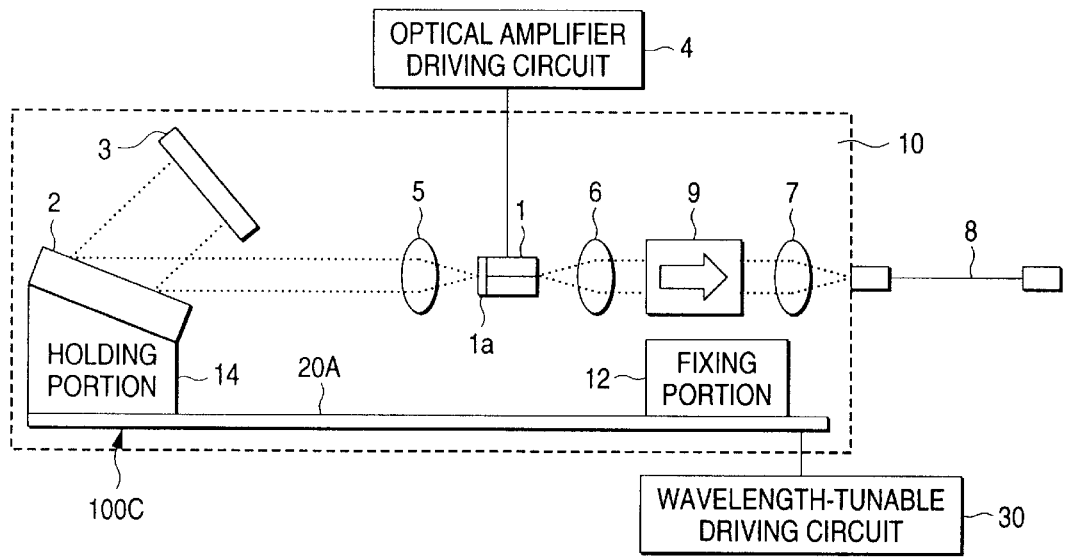
FIG. 3 is a block diagram showing a configuration of an external cavity type wavelength-tunable light source according to a third embodiment to which the present invention is applied.

FIG. 3 is a block diagram showing a configuration of an external cavity type wavelength-tunable light source according to a third embodiment to which the present invention is applied.

In this case, in FIG. 3, the same parts as those shown in the above figures are designated by the same reference numerals and their description will be omitted.

In the external cavity type wavelength-tunable light source according to the third embodiment, a wavelength tuning mechanism 100C changes the angle of the diffraction grating 2 in place of the reflector 3 to tune the wavelength of the lasing light beam.

The diffraction grating 2 is arranged to have an incident angle α relative to an emission light axis of the optical amplifier 1. Also, the diffraction grating 2 is fixed to one end of the wavelength-tunable controlling unit 20A via the holding portion 14, and the other end of the wavelength-tunable controlling unit 20A is fixed to the fixing portion 12 on the optical base platform 10.

The reflector 3 is provided to the optical base platform 10 such that the reflected light beams of a particular wavelength reflected from the diffraction grating 2 are input perpendicularly into the reflector 3.

The wavelength tuning mechanism 100C comprises the fixing portion 12 and the holding portion 11 set forth as the fixing means, the wavelength-tunable controlling unit (bimorph type piezo-electric element) 20A set forth as the elastic body of the fixing means and the displacing means, and the wavelength-tunable driving circuit 30 set forth as the displacement controlling means. The wavelength tuning mechanism 100C tunes the wavelength of the lasing light beam by changing the angle of the diffraction grating 2 relative to the emission light axis of the optical amplifier 1.

In the external cavity type wavelength-tunable light source constructed as above, the bimorph type piezo-electric element is curved and deformed by controlling the voltage which is applied to the bimorph type piezo-electric element serving as the wavelength-tunable controlling unit 20A to change the incident angle α of the diffraction grating 2 being supported by the bimorph type piezo-electric element, so that the wavelength of the light beam which input perpendicularly into the reflector 3 can be changed.

That is, the wavelength of the lasing light beam is tuned by controlling the voltage, which is applied to the wavelength-tunable controlling unit (bimorph type piezo-electric element) 20A, by using the wavelength-tunable driving circuit 30.

<Fourth Embodiment>

Figure 4:
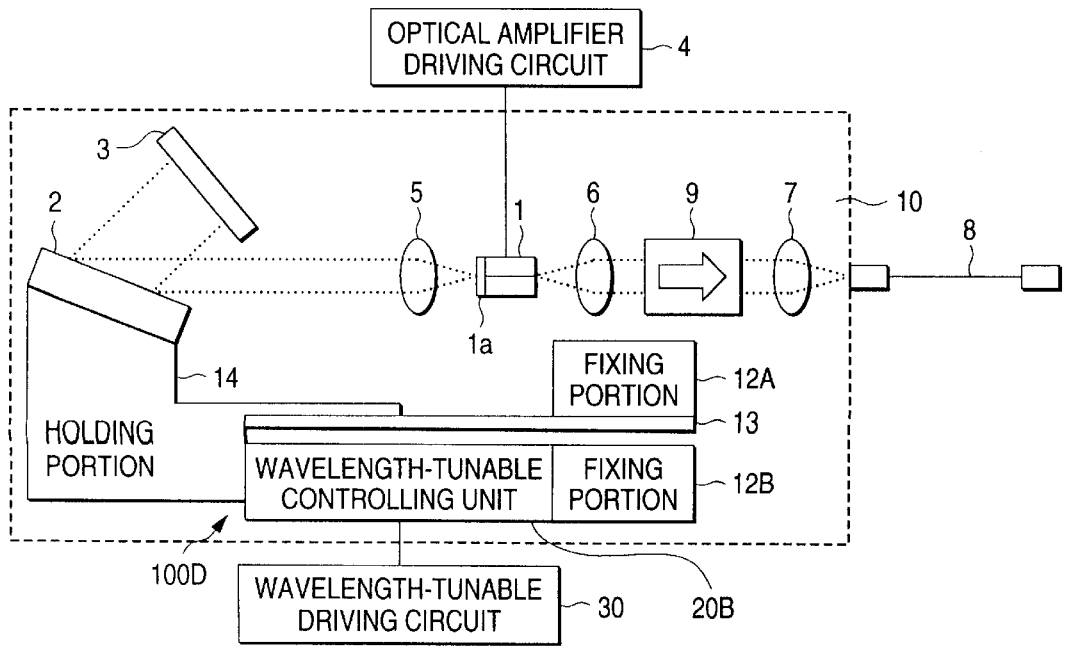
FIG. 4 is a block diagram showing a configuration of an external cavity type wavelength-tunable light source according to a fourth embodiment to which the present invention is applied.

FIG. 4 is a block diagram showing a configuration of an external cavity type wavelength-tunable light source according to a fourth embodiment to which the present invention is applied.

In this case, in FIG. 4, the same parts as those shown in the above figures are designated by the same reference numerals and their description will be omitted.

In the external cavity type wavelength-tunable light source according to the fourth embodiment, the diffraction grating 2 is arranged to have an incident angle α relative to the emission light axis of the optical amplifier 1. Also, the diffraction grating 2 is fixed to one end of the leaf spring portion 13 via the holding portion 14, and the other end of the leaf spring portion 13 is fixed to the fixing portion 12A on the optical base platform 10.

The wavelength-tunable controlling unit 20B is composed of the laminated type piezo-electric element. The wavelength-tunable controlling unit 20B is arranged such that one end of the wavelength-tunable controlling unit 20B is connected to the fixing portion 12B and the other end thereof is connected to the holding portion 14.

A wavelength tuning mechanism 100D comprises the fixing portion 12A and the holding portion 14 set forth as the fixing means, the leaf spring portion 13 set forth as the elastic body of the fixing means, the wavelength-tunable controlling unit (laminated type piezo-electric element) 20B set forth as the displacing means, the wavelength-tunable driving circuit 30 set forth as the displacement controlling means, the fixing portion 12B for fixing the wavelength-tunable controlling unit 20B and the like. The wavelength tuning mechanism 100D tunes the wavelength of the lasing light beam by changing the angle of the diffraction grating 2 relative to the emission light axis of the optical amplifier 1.

In the external cavity type wavelength-tunable light source constructed as above, displacement is generated in the laminated type piezo-electric element by controlling the voltage which is applied to the laminated type piezo-electric element serving as the wavelength-tunable controlling unit 20B to flex the leaf spring portion 13 and to thus change the incident angle α of the diffraction grating 2 arranged on the free end side of the leaf spring portion 13, so that the wavelength of the light beam which input perpendicularly into the reflector 3 can be changed.

That is, the wavelength of the lasing light beam is tuned by controlling the voltage, which is applied to the wavelength-tunable controlling unit (laminated type piezo-electric element) 20B, by using the wavelength-tunable driving circuit 30.

<Fifth Embodiment>

Figure 5:
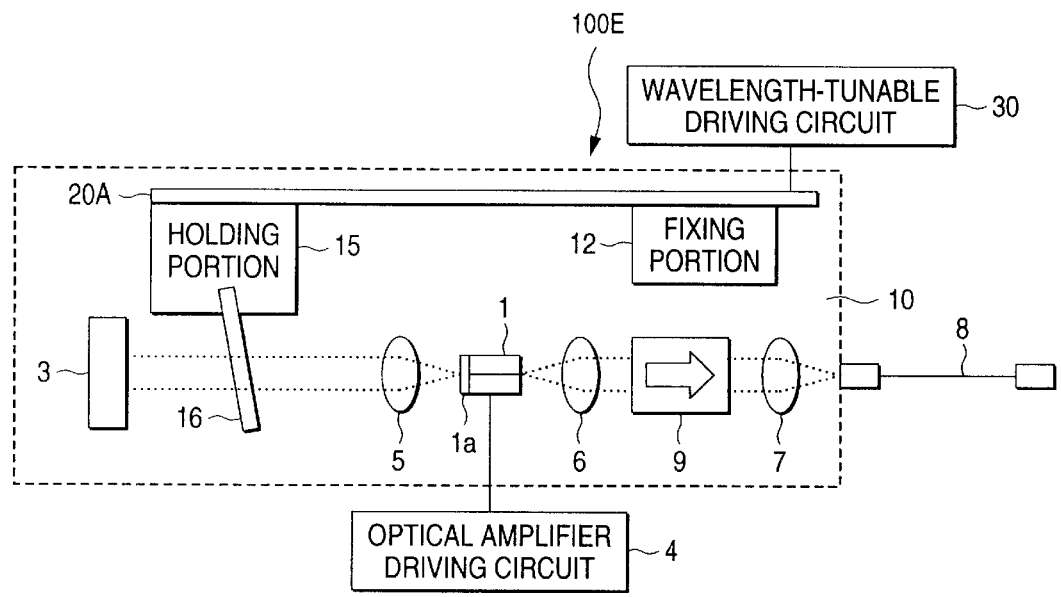
FIG. 5 is a block diagram showing a configuration of an external cavity type wavelength-tunable light source according to a fifth embodiment to which the present invention is applied.

FIG. 5 is a block diagram showing a configuration of an external cavity type wavelength-tunable light source according to a fifth embodiment to which the present invention is applied.

In this case, in FIG. 5, the same parts as those shown in the above figures are designated by the same reference numerals and their description will be omitted.

In the external cavity type wavelength-tunable light source according to the fifth embodiment, a bandpass filter 16 is employed instead of the diffraction grating 2, and a wavelength tuning mechanism 100E changes the angle of the bandpass filter 16 to tune the wavelength of the lasing light beam.

The bandpass filter 16 is arranged to have a predetermined incident angle relative to an emission light axis of the optical amplifier 1. Also, the bandpass filter 16 is fixed to one end of the wavelength-tunable controlling unit 20A via the holding portion 15, and the other end of the wavelength-tunable controlling unit 20A is fixed to the fixing portion 12 on the optical base platform 10.

The reflector 3 is provided to the optical base platform 10 such that the light beams transmitted from the bandpass filter 16 are reflected to the emission light axis of the optical amplifier 1.

The wavelength tuning mechanism 100E comprises the fixing portion 12 and the holding portion 15 set forth as the fixing means, the wavelength-tunable controlling unit (bimorph type piezo-electric element) 20A set forth as the elastic body of the fixing means and the displacing means, and the wavelength-tunable driving circuit 30 set forth as the displacement controlling means.

In the external cavity type wavelength-tunable light source constructed as above, the bimorph type piezo-electric element is curved and deformed by controlling the voltage which is applied to the bimorph type piezo-electric element serving as the wavelength-tunable controlling circuit 20A, so that the angle of the bandpass filter 16 which is supported by the bimorph type piezo-electric element with respect to the emission light axis of the optical amplifier 1 can be changed.

Since the thickness of the transmitted multi-layered film or the cavity length is changed equivalently if the incident angle into the bandpass filter 16 is changed, a peak wavelength of the transmitted light beam can be changed.

That is, the wavelength of the light beam which is transmitted through the bandpass filter 16 to return to the optical amplifier 1, i.e., the wavelength of the lasing light beam is tuned by controlling the voltage, which is applied to the wavelength-tunable controlling unit (bimorph type piezo-electric element) 20A, by using the wavelength-tunable driving circuit 30.

<Sixth Embodiment>

Figure 6:
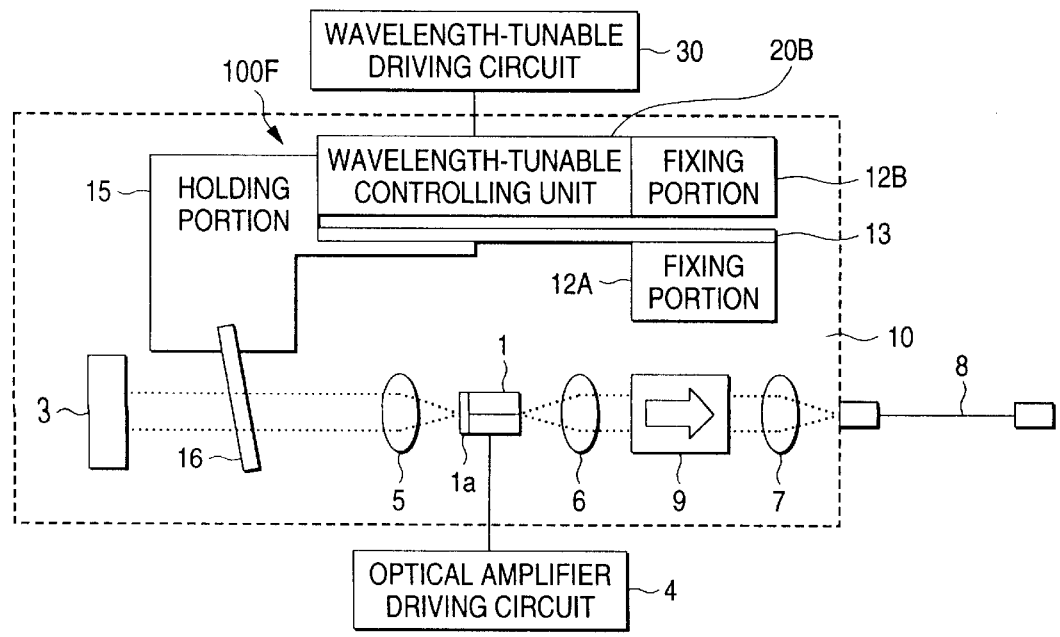
FIG. 6 is a block diagram showing a configuration of an external cavity type wavelength-tunable light source according to a sixth embodiment to which the present invention is applied.
Figure 7:
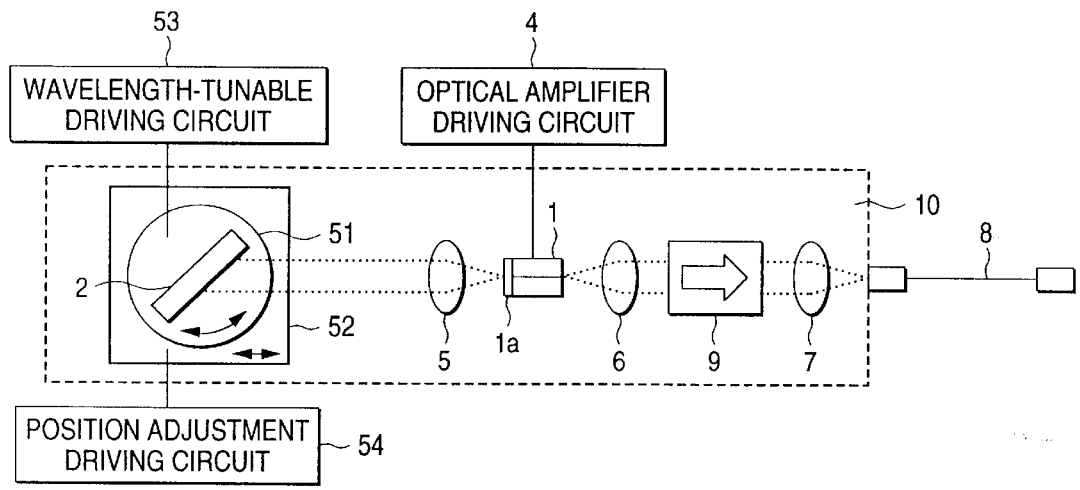
FIG. 7 is a block diagram showing a configurational example (Littrow arrangement) of a conventional external cavity type wavelength-tunable light source.
Figure 8:
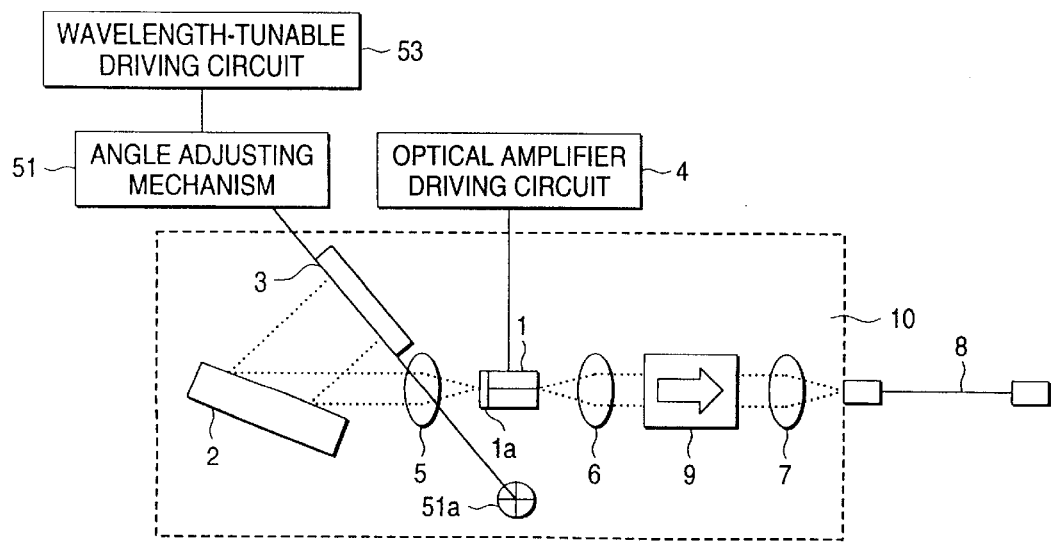
FIG. 8 is a block diagram showing a configurational example (Littman arrangement) of another conventional external cavity type wavelength-tunable light source.

FIG. 6 is a block diagram showing a configuration of an external cavity type wavelength-tunable light source according to a sixth embodiment to which the present invention is applied.

In this case, in FIG. 6, the same parts as those shown in the above figures are designated by the same reference numerals and their description will be omitted.

In the external cavity type wavelength-tunable light source according to the sixth embodiment, the bandpass filter 16 is arranged to have a predetermined incident angle relative to the emission light axis of the optical amplifier 1. Also, the bandpass filter 16 is fixed to one end of the leaf spring portion 13 via the holding portion 15, and the other end of the leaf spring portion 13 is fixed to the fixing portion 12A on the optical base platform 10.

The wavelength-tunable controlling unit 20B is composed of the laminated type piezo-electric element. The wavelength-tunable controlling unit 20B is arranged such that one end of the wavelength-tunable controlling unit 20B is connected to the fixing portion 12B and the other end thereof is connected to the holding portion 15.

A wavelength tuning mechanism 100F comprises the fixing portion 12A and the holding portion 15 set forth as the fixing means, the leaf spring portion 13 set forth as the elastic body of the fixing means, the wavelength-tunable controlling unit (laminated type piezo-electric element) 20B set forth as the displacing means, the wavelength-tunable driving circuit 30 set forth as the displacement controlling means, the fixing portion 12B for fixing the wavelength-tunable controlling unit 20B and the like. The wavelength tuning mechanism 100F tunes the wavelength of the lasing light beam by changing the angle of the bandpass filter 16 relative to the emission light axis of the optical amplifier 1.

In the external cavity type wavelength-tunable light source constructed as above, displacement is generated in the laminated type piezo-electric element by controlling the voltage which is applied to the laminated type piezo-electric element serving as the wavelength-tunable controlling unit 20B to flex the leaf spring portion 13, so that the angle of the bandpass filter 16 which is placed at the free end side of the leaf spring portion 13 with respect to the emission light axis of the optical amplifier 1 can be changed.

Since the thickness of the transmitted multi-layered film or the cavity length is changed equivalently if the incident angle into the bandpass filter 16 is changed, the peak wavelength of the transmitted light beam can be changed.

That is, the wavelength of the light beam which is transmitted through the bandpass filter 16 to return to the optical amplifier 1, i.e., the wavelength of the lasing light beam is tuned by controlling the voltage, which is applied to the wavelength-tunable controlling unit (laminated type piezo-electric element) 20B, by using the wavelength-tunable driving circuit 30.

The semiconductor laser is exemplified as the optical amplifier 1 in the above embodiments, but the optical amplifier 1 is not limited to this. For example, a solid laser, a gas laser, a fiber laser or the like may be employed.

As the reflector 3, for example, a plane reflection mirror, a dihedral mirror using a rectangular prism or the like may be employed. In the third embodiment, a corner-cube prism may be employed in addition to the above.

As the bandpass filter 16, for example, a multi-layered film filter in which a multi-layered film is formed on an optical substrate, a Fabry-Perot etalon (FP etalon) or the like may be employed.

According to the external cavity type wavelength-tunable light source of the present invention, the displacement controlling means controls the displacing means to deform elastically the elastic body of the fixing means, and as a result the angle of the reflector, the diffraction grating, or the bandpass filter, which is supported by the fixing means, is changed relative to the light axis. Therefore, the wavelength of the lasing light beam can be tuned precisely without generation of the mechanical backlash.

The piezo-electric element is employed as the displacing means, then a displacement amount of the piezo-electric element is changed by adjusting the voltage which is applied to the piezo-electric element, and thus the angle of the reflector, the diffraction grating, or the bandpass filter, which is held by the fixing means, can be changed. Therefore, the wavelength of the lasing light beam can be tuned electrically.

If the bimorph type piezo-electric element is used commonly as both the elastic body of the fixing means for supporting the reflector, the diffraction grating, or the bandpass filter, and the displacing means, the configuration of the external cavity type wavelength-tunable light source can be reduced in size since reduction in the number of the constituent parts and reduction in size of the constituent parts can be achieved.

What is claimed is:

1. An external cavity type wavelength-tunable light source comprising:

an optical amplifier on one end surface of which an antireflection film is coated;

a diffraction grating arranged on an emission light axis of the optical amplifier on the side of the antireflection film and having wavelength selectivity;

a reflector arranged on a reflection light axis of the diffraction grating, for reflecting a reflection light beam from the diffraction grating; and a wavelength tuning mechanism for tuning a wavelength of an lasing light beam by changing an angle of the reflector relative to the reflection light axis of the diffraction grating, wherein the wavelength tuning mechanism includes:

fixing means at least a part of which is composed of an elastic body to support the reflector;

displacing means for changing an angle of the reflector relative to the reflection light axis of the diffraction grating by deforming the elastic body of the fixing means; and displacement controlling means for controlling the displacing means to adjust change in the angle of the reflector and to thus tune the wavelength of the lasing light beam.

2. The external cavity type wavelength-tunable light source according to claim 1, wherein the elastic body of the fixing means includes a bimorph type piezo-electric element which is employed commonly as the displacing means.

3. The external cavity type wavelength-tunable light source according to claim 1, wherein the elastic body of the fixing means includes a leaf spring, and the displacing means includes a laminated type piezo-electric element.

4. An external cavity type wavelength-tunable light source comprising:

an optical amplifier on one end surface of which an antireflection film is coated;

a diffraction grating arranged on an emission light axis of the optical amplifier on the side of the antireflection film and having wavelength selectivity;

a reflector arranged on a reflection light axis of the diffraction grating, for reflecting a reflection light beam from the diffraction grating; and a wavelength tuning mechanism for tuning a wavelength of an lasing light beam by changing an angle of the diffraction grating relative to the emission light axis of the optical amplifier, wherein the wavelength tuning mechanism includes:

fixing means at least a part of which is composed of an elastic body to support the diffraction grating;

displacing means for changing an angle of the diffraction grating relative to the emission light axis of the optical amplifier by deforming the elastic body of the fixing means; and displacement controlling means for controlling the displacing means to adjust change in the angle of the diffraction grating and to thus tune the wavelength of the lasing light beam.

5. The external cavity type wavelength-tunable light source according to claim 4, wherein the elastic body of the fixing means includes a bimorph type piezo-electric element which is employed commonly as the displacing means.

6. The external cavity type wavelength-tunable light source according to claim 4, wherein the elastic body of the fixing means includes a leaf spring, and the displacing means includes a laminated type piezo-electric element.

7. An external cavity type wavelength-tunable light source comprising:

an optical amplifier on one end surface of which an antireflection film is coated;

a bandpass filter arranged on an emission light axis of the optical amplifier on the side of the antireflection film and having wavelength selectivity;

a reflector arranged on an emission light axis of the optical amplifier, for reflecting a transmission light beam from the bandpass filter to the emission light axis of the optical amplifier; and a wavelength tuning mechanism for tuning a wavelength of an lasing light beam by changing an angle of the bandpass filter relative to the emission light axis of the optical amplifier, wherein the wavelength tuning mechanism includes:

fixing means at least a part of which is composed of an elastic body to support the bandpass filter;

displacing means for changing an angle of the bandpass filter relative to the emission light axis of the optical amplifier by deforming the elastic body of the fixing means; and displacement controlling means for controlling the displacing means to adjust change in the angle of the bandpass filter and to thus tune the wavelength of the lasing light beam.

8. The external cavity type wavelength-tunable light source according to claim 7, wherein the elastic body of the fixing means includes a bimorph type piezo-electric element which is employed commonly as the displacing means.

9. The external cavity type wavelength-tunable light source according to claim 7, wherein the elastic body of the fixing means includes a leaf spring, and the displacing means includes a laminated type piezo-electric element.

* * * * *

UNITED STATES PATENT AND TRADEMARK OFFICE
CERTIFICATE OF CORRECTION

PATENT NO. : 6,018,535
DATED : January 25, 2000
INVENTOR(S) : Minoru Maeda

It is certified that error appears in the above-identified patent and that said Letters Patent is hereby corrected as shown below:

Title Page, Item [73], in the Assignee, "LTD." should read --Ltd.--.

Title Page, Item [57], in the Abstract, line 9, "an lasing" should read --a lasing--.

Claim 1 Column 12:
Line 54, "an lasing" should read --a lasing--.

Claim 4 Column 13:
Line 21, "an lasing" should read --a lasing--.

Claim 7 Column 14:
Line 16, "an lasing", should read --a lasing--.

Signed and Sealed this

Twelfth Day of June, 2001

*Attest:*

*Attesting Officer*

NICHOLAS P. GODICI
*Acting Director of the United States Patent and Trademark Office*